(12) United States Patent
Rachmady et al.

(10) Patent No.: US 7,776,729 B2
(45) Date of Patent: Aug. 17, 2010

(54) TRANSISTOR, METHOD OF MANUFACTURING SAME, ETCHANT FOR USE DURING MANUFACTURE OF SAME, AND SYSTEM CONTAINING SAME

(75) Inventors: Willy Rachmady, Beaverton, OR (US); Vijay Ramachandrarao, Portland, OR (US); Oleg Golonzka, Beaverton, OR (US); Arnel M. Fajardo, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 11/607,549

(22) Filed: Nov. 30, 2006

(65) Prior Publication Data

US 2008/0128763 A1 Jun. 5, 2008

(51) Int. Cl.
*H01L 21/3205* (2006.01)
(52) U.S. Cl. .................................... 438/585; 257/288
(58) Field of Classification Search .............. 257/288; 438/259, 292, 637
See application file for complete search history.

(56) References Cited

U.S. PATENT DOCUMENTS

| | | | | |
|---|---|---|---|---|
| 6,054,355 | A * | 4/2000 | Inumiya et al. | 438/296 |
| 2006/0030143 | A1* | 2/2006 | Ivanov | 438/622 |
| 2006/0046449 | A1* | 3/2006 | Liaw | 438/585 |
| 2006/0199321 | A1* | 9/2006 | Lo et al. | 438/197 |
| 2006/0216920 | A1* | 9/2006 | Kojima | 438/618 |

OTHER PUBLICATIONS

Peter Singer, "The Advantages of Capping Copper With Cobalt", http://www.reed-electronics.com/semiconductor/index.asp?layout=articlePrint&articleID=CA6260705, pp. 1-4; Oct. 2005.
Y. Sverdlov et al., "Electrochemical Study of the Electroless Deposition of Co(W, B) Alloys", J. Electrochemical Soc., 152 (9) C631-C638, 2005.
H. Nakano, et al., "Electroless Deposited Cobalt-Tungsten-Boron-Capping Barrier Metal on Damascene Copper Interconnection", J. Electrochemical Soc., 152 (3) C163-C166, 2005.
T. Osaka et al., "Characterization of chemically-deposited NiB and NiWB thin films as a capping layer for ULSI application", Elsevier, Science Direct, pp. 124-127, 2003.
C.-K. Hu et al., "Reduced Cu interface diffusion by CoWP surface coating", Elsevier, Science Direct, Microelectronic Engineering, 70 (2003) 406-411.
T. Ko et al., "High Performance/Reliability Cu Interconnect with Selective CoWP Cap", 2003 Symposium on VLSI Tech Digest of Tech. Papers, pp. 109-110.

* cited by examiner

*Primary Examiner*—Kiesha R Bryant
*Assistant Examiner*—Mark W Tornow
(74) *Attorney, Agent, or Firm*—Kenneth A. Nelson

(57) ABSTRACT

A transistor comprises a gate (110) comprising a gate electrode (111) and a gate dielectric (112), an electrically insulating cap (120, 720) over the gate, and a source/drain contact (130) adjacent to the gate. The electrically insulating cap prevents electrical contact between the gate and the source/drain contact. In one embodiment, the electrically insulating cap is formed in a trench (160, 660) that is self-aligned to the gate and that is created by the removal of a sacrificial cap using an aqueous solution comprising a carboxylic acid and a corrosion inhibitor.

5 Claims, 5 Drawing Sheets

TRANSISTOR, METHOD OF MANUFACTURING SAME, ETCHANT FOR USE DURING MANUFACTURE OF SAME, AND SYSTEM CONTAINING SAME

FIELD OF THE INVENTION

The disclosed embodiments of the invention relate generally to transistors, and relate more particularly to protective etch stop layers for transistors.

BACKGROUND OF THE INVENTION

As pitch scaling continues to increase the packing density of transistors on computer chips, the separation between a transistor's source/drain contacts and its gate is rapidly decreasing. If current pitch scaling trends continue, the creation of unwanted electrical contact between source/drain contact and gate will quickly become unavoidable under existing transistor manufacturing techniques. Accordingly, there exists a need for transistor manufacturing methods and structures capable of preventing the creation of such unwanted electrical contact.

BRIEF DESCRIPTION OF THE DRAWINGS

The disclosed embodiments will be better understood from a reading of the following detailed description, taken in conjunction with the accompanying figures in the drawings in which.

Figure 1:
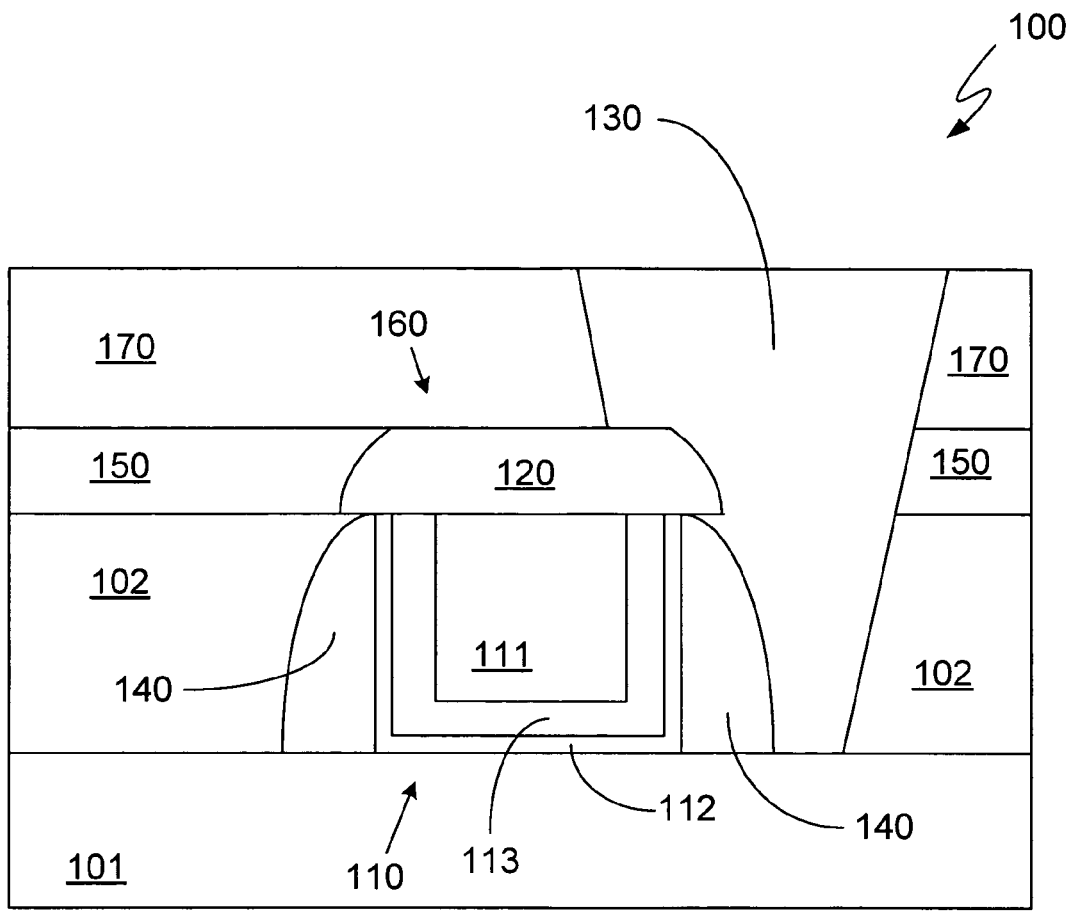
FIG. 1 is a cross-sectional view of a transistor according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used.

DETAILED DESCRIPTION OF THE DRAWINGS

In one embodiment of the invention, a transistor comprises a gate comprising a gate electrode and a gate dielectric, an etch stop film or electrically insulating cap over the gate, and a source/drain contact adjacent to the gate. The electrically insulating cap prevents electrical contact between the gate and the source/drain contact. In one embodiment, the electrically insulating cap is formed in a trench that is self-aligned to the gate and that is created by removing a sacrificial cap using a wet etchant chemistry that comprises an aqueous solution comprising a carboxylic acid and a corrosion inhibitor. The electrically insulating cap serves as a non-conducting etch stop layer that protects the transistor gate during source/drain contact etch, thereby increasing the margin for source/drain contact registration and critical dimension and preventing unwanted electrical contact (short) between source/drain contact and gate electrode.

Referring now to the figures, FIG. 1 is a cross-sectional view of a transistor 100 according to an embodiment of the invention. As illustrated in FIG. 1, transistor 100 comprises a substrate 101 and a gate 110 over substrate 101. Transistor 100 lies at least partially within an interlayer dielectric 102 (which may also be referred to as "ILD0" because it is the first interlayer dielectric above substrate 101). Gate 110 comprises a gate electrode 111 and a gate dielectric 112. As an example, gate electrode 111 can be a metal gate electrode comprising copper or the like. In the illustrated embodiment gate 110 further comprises a workfunction metal 113 between gate electrode 111 and gate dielectric 112.

As another example, gate dielectric 112 can comprise a material having a high dielectric constant. (Such a material is referred to herein as a "high-k material" or the like.) Silicon dioxide, which has in the past been widely used as a gate dielectric, has a dielectric constant (k) of approximately 3.9. A perfect vacuum has a dielectric constant defined as 1.

Accordingly, any material having a dielectric constant greater than approximately 10 likely qualifies as, and is referred to herein as, a high-k material. As an example, the high-k material used in an embodiment of transistor 100 may be a hafnium-based, a zirconium-based, or a titanium-based dielectric material that may have a dielectric constant of at least approximately 20. In a particular embodiment the high-k material is hafnium oxide having a dielectric constant of between approximately 20 and approximately 40. In a different particular embodiment the high-k material is zirconium oxide having a dielectric constant of between approximately 20 and approximately 40.

Transistor 100 further comprises an etch stop film or electrically insulating cap 120 over gate 110, a source/drain contact 130 adjacent to gate 110, and spacers 140 adjacent to gate 110. As will be further discussed below, electrically insulating cap 120 prevents unwanted electrical contact (also referred to as an "electrical short," or simply a "short") between gate 110 and source/drain contact 130. As an example, electrically insulating cap 120 can comprise silicon nitride ($Si_3N_4$) or the like.

Transistor 100 still further comprises an electrically insulating layer 150 over gate 110, a trench 160 in electrically insulating layer 150 and aligned to gate 110, and an electrically insulating layer 170 over electrically insulating layer 150. As an example, one or both of electrically insulating layers 150 and 170 can comprise silicon dioxide, a dielectric such as is found in interlayer dielectric 102, or the like. Trench 160 is not readily visible in FIG. 1 because it is filled by electrically insulating cap 120, but trench 160 or a similar trench will be more clearly illustrated in a subsequent figure.

Figure 2:
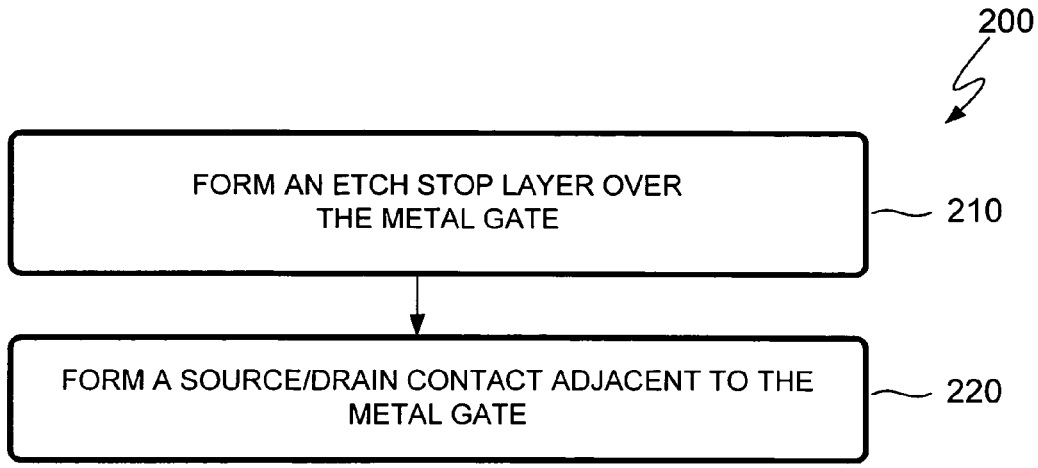
FIG. 2 is a flowchart illustrating a method of manufacturing a transistor according to an embodiment of the invention.

FIG. 2 is a flowchart illustrating a method 200 of manufacturing a transistor having a metal gate according to an embodiment of the invention. In at least one embodiment, method 200 protects the metal gate during an etch that is part of the formation of a source/drain contact of the transistor. A step 210 of method 200 is to form an etch stop layer over the metal gate. As an example, the transistor can be similar to transistor 100, first shown in FIG. 1. As another example, the etch stop layer and the metal gate can be similar to, respectively, electrically insulating cap 120 and gate 110, both of which were first shown in FIG. 1. In one embodiment, forming the etch stop layer comprises aligning the etch stop layer to the metal gate.

A step 220 of method 200 is to form a source/drain contact adjacent to the metal gate. Step 220 can be performed according to well known techniques. In one embodiment, step 220 can include forming a dielectric or gapfill layer that can be similar to electrically insulating layer 170 shown in FIG. 1. As an example, the source/drain contact can be similar to source/drain contact 130, first shown in FIG. 1. In one embodiment, the etch stop layer/electrically insulating cap protects the metal gate by preventing the formation of an unwanted electrical connection between the metal gate and the source/drain contact. As an example, the etch stop layer/electrically insulating cap is: (1) impervious to the chemistry used during the source/drain contact etch, thus protecting the metal gate during such source/drain contact etch; and (2) electrically insulating such that no unwanted electrical connection can be formed between the (electrically conducting) metal gate and the (electrically conducting) source/drain contact. Accordingly, and as alluded to earlier, the etch stop layer/electrically insulating cap allows a larger margin of error regarding source/drain contact registration, thus enabling the formation of larger source/drain contacts. Among other possible advantages, larger source/drain contacts are easier to make and/or exhibit less contact resistance.

Figure 3:
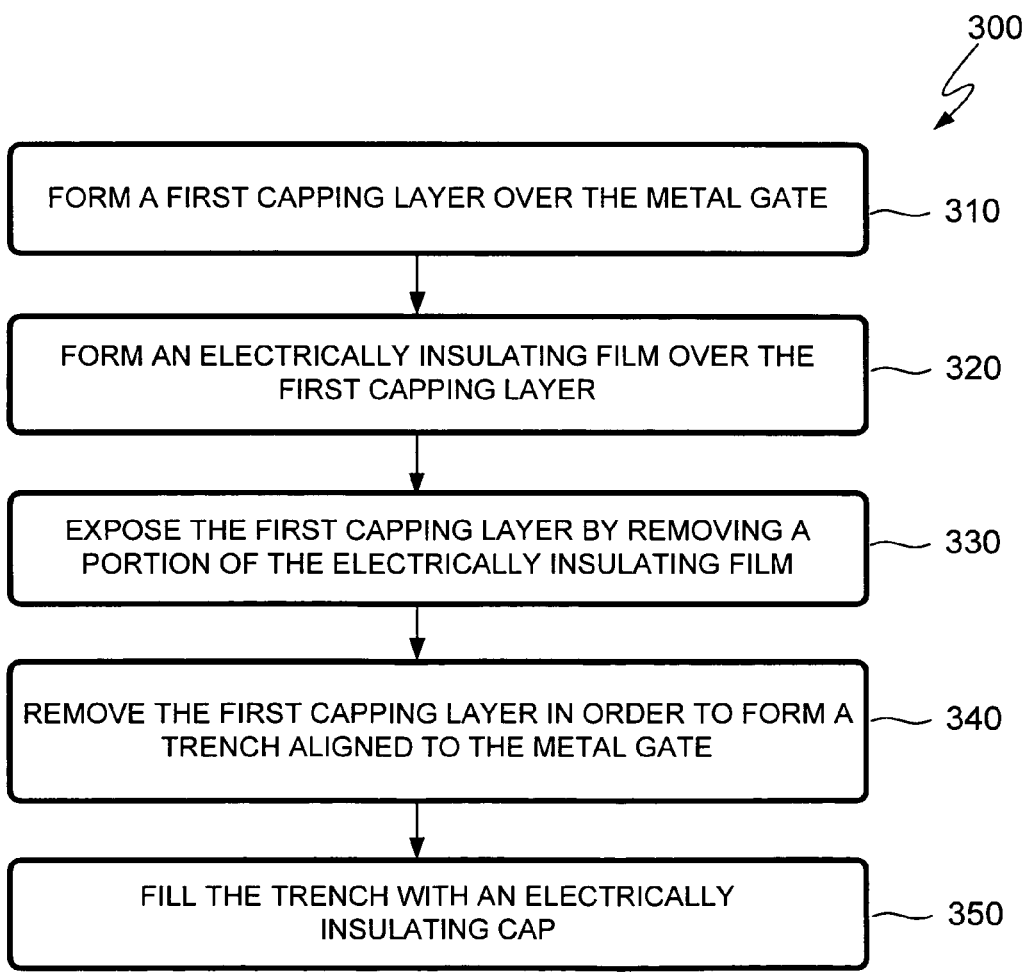
FIG. 3 is a flowchart illustrating a method of forming an etch stop layer according to an embodiment of the invention.

FIG. 3 is a flowchart illustrating a method 300 of forming an etch stop layer according to an embodiment of the invention. Accordingly, method 300 can represent one method of performing step 210 of method 200.

A step 310 of method 300 is to form a first capping layer over the metal gate. As an example, the first capping layer can be similar to a sacrificial capping layer 410, first shown in FIG. 4, which is a cross sectional view of transistor 100 at a particular point in its manufacturing process according to an embodiment of the invention. In one embodiment, step 310 comprises electrolessly depositing the first capping layer. In that embodiment, and possibly in other embodiments, the first capping layer is selectively grown or otherwise formed over the gate (as opposed to a blanket formation), meaning that following such selective formation the first capping layer is located only (or substantially only) over the gate.

In the same or another embodiment, step 310 comprises forming a layer comprising cobalt or a cobalt alloy. It was mentioned above that the metal gate can comprise copper. Indeed, copper is perhaps the most frequently-used material for metal transistor gates. Cobalt is one of only a few metals that will grow selectively on copper (nickel is another), and it is for at least that reason that cobalt or a cobalt alloy is used in at least one embodiment as a material in the first capping layer. In another embodiment nickel or a nickel alloy may be used as a material in the first capping layer.

Figure 4:
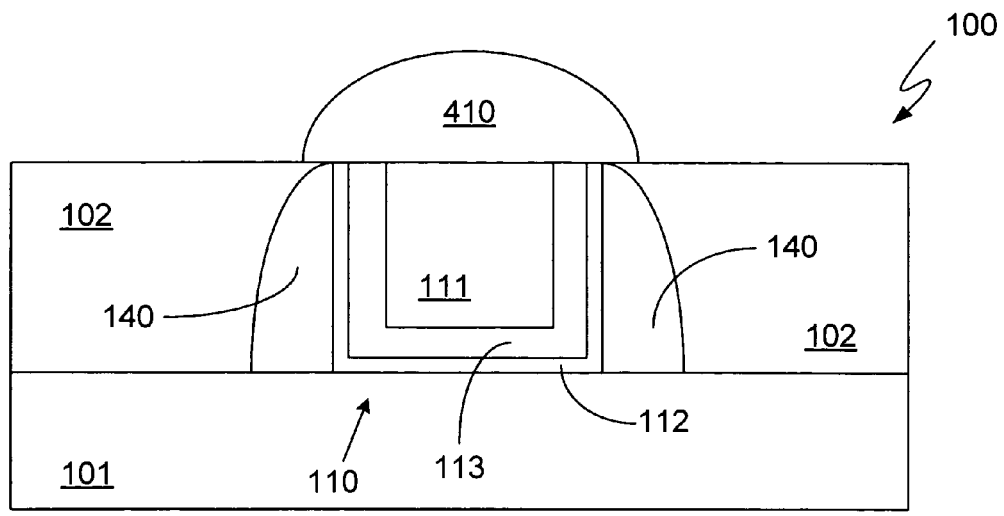
FIG. 4 is a cross sectional view of the transistor of FIG. 1 at a particular point in its manufacturing process according to an embodiment of the invention.

As mentioned, FIG. 4 depicts transistor 100 at a point in its manufacturing process when sacrificial capping layer 410 is temporarily located over gate 110. As will be further discussed below, sacrificial capping layer 410 is removed prior to the formation of the electrically insulating cap. As an example, and as suggested above, sacrificial capping layer 410 can comprise cobalt, a cobalt alloy, nickel, a nickel alloy, or the like. Removing sacrificial capping layer 410 creates a trench in which an electrically insulating and protective etch stop cap may be formed, as will subsequently be discussed in greater detail.

Figure 5:
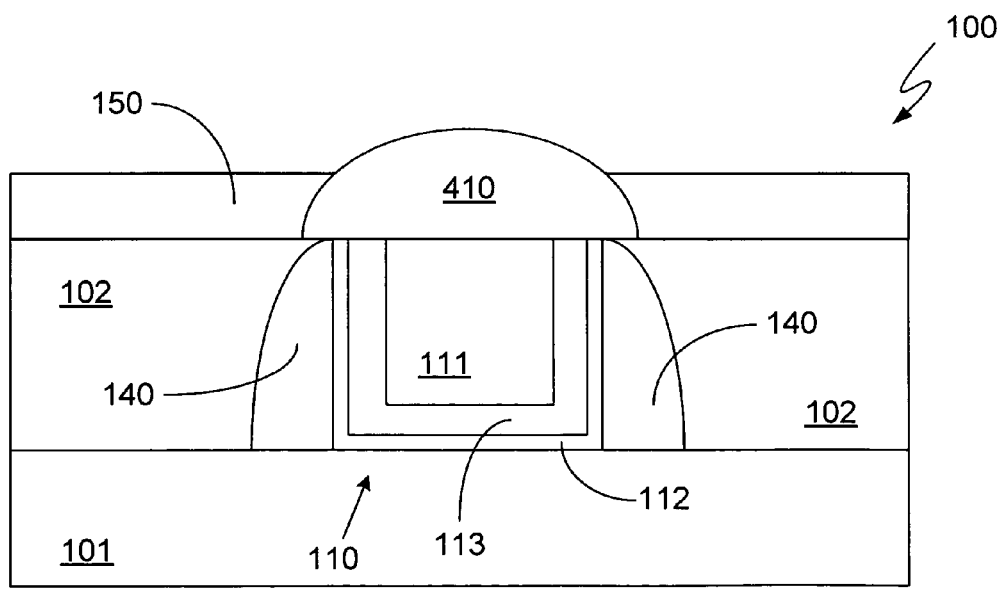
FIG. 5 is a cross sectional view of the transistor of FIG. 1 at a different point in its manufacturing process according to an embodiment of the invention.

A step 320 of method 300 is to form an electrically insulating film or electrically insulating layer over the first capping layer. As an example, the electrically insulating layer can be similar to electrically insulating layer 150, first shown in FIG. 1. Electrically insulating layer 150, together with additional components of transistor 100, is also illustrated in FIG. 5, which is a cross sectional view of transistor 100 at a particular point in its manufacturing process according to an embodiment of the invention. In one embodiment, step 320 comprises depositing a film of silicon dioxide or the like over the first capping layer.

A step 330 of method 300 is to expose the first capping layer by removing a portion of the electrically insulating layer. In FIG. 5, electrically insulating layer 150 is depicted after the performance of step 330. In one embodiment, step 330 comprises planarizing and polishing back electrically insulating layer 150 until the first capping layer is exposed, according to techniques known in the art.

Figure 6:
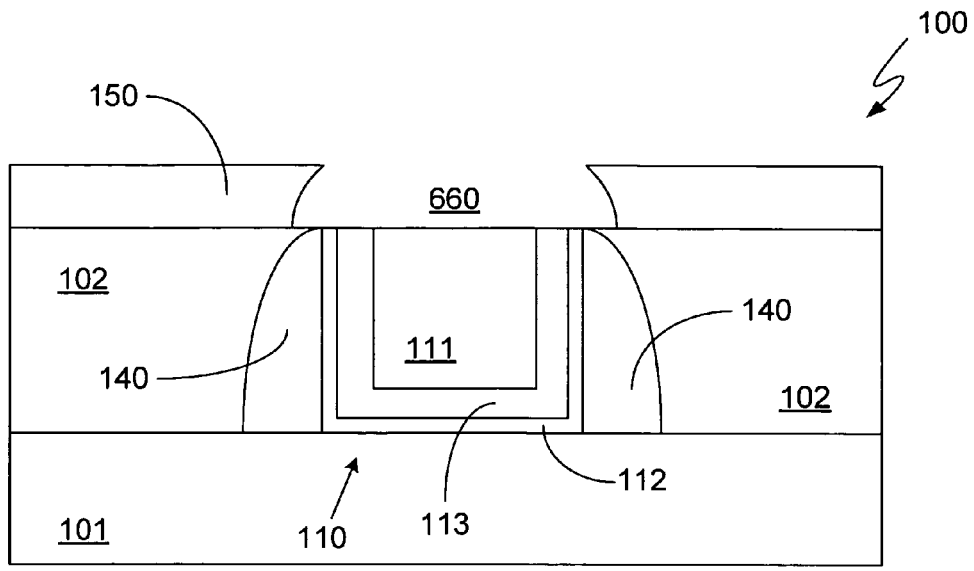
FIG. 6 is a cross sectional view of the transistor of FIG. 1 at a different point in its manufacturing process according to an embodiment of the invention.

A step 340 of method 300 is to remove the first capping layer in order to form a trench aligned to the metal gate. As an example, the trench can be similar to trench 160, first shown in FIG. 1. As another example, the trench can be similar to a trench 660, first shown in FIG. 6, which is a cross sectional view of transistor 100 at a particular point in its manufacturing process according to an embodiment of the invention. As implied by the foregoing, trench 660 can be similar to trench 160.

In one embodiment, step 340 comprises etching or dissolving the first capping layer using a wet etchant chemistry that is an aqueous solution comprising a carboxylic acid and a corrosion inhibitor. In one embodiment, the wet etchant chemistry further comprises a buffer capable of adjusting or otherwise manipulating or controlling a pH of the aqueous solution. In the same or another embodiment, the wet etchant chemistry is selective to (protective of) the ILD0 material and to the metal that makes up the metal gate, including the metal gate electrode and the workfunction metal that were introduced above, but is capable of etching or dissolving the material that forms the first capping layer. Accordingly, in a particular embodiment the wet etchant chemistry is capable of etching cobalt but is selective to copper and any additional materials that form a part of the gate. In one embodiment, the wet etchant chemistry is applied to a wafer containing the transistor in an immersion (wet bench) or a spray tool.

In one embodiment, the carboxylic acid comprises no more than approximately 50 percent by weight of the aqueous solution and the corrosion inhibitor comprises no greater than approximately 0.2 percent by weight of the aqueous solution. In the same or another embodiment, the buffer comprises no more than approximately 10 percent by weight of the aqueous solution.

In one embodiment, the carboxylic acid comprises an α-hydroxy acid, such as citric acid, glycolic acid, lactic acid, malic acid, tartaric acid, or the like. In the same or another embodiment, the corrosion inhibitor comprises benzotriazole, 1-Dodecanethiol, 2-Mercaptobenzimidazole, or the like, and the buffer comprises hydrochloric acid (HCl), ammonium hydroxide ($NH_4OH$), or the like.

A step 350 of method 300 is to fill the trench with an electrically insulating cap. As an example, the electrically insulating cap can be similar to electrically insulating cap 120, first shown in FIG. 1. As another example, the electrically insulating cap can be similar to an electrically insulating cap 720, first shown in FIG. 7, which is a cross-sectional view of transistor 100 at a particular point in its manufacturing process according to an embodiment of the invention. As implied by the foregoing, electrically insulating cap 720 can be similar to electrically insulating cap 120.

In one embodiment, step 350 or another step comprises depositing or otherwise forming a blanket etch stop layer over the metal gate and a surrounding interlayer dielectric (such as interlayer dielectric 102, first shown in FIG. 1) and then planarizing and removing a portion of the etch stop layer such that the electrically insulating cap remains only (or substantially only) in the trench, which is to say that the electrically insulating cap remains only (or substantially only) over the metal gate. As an example, the portion of the etch stop layer can be removed in a chemical mechanical polish (CMP) operation in which the etch stop layer is polished down to the surface of the interlayer dielectric, at which point the electrically insulating cap fills or substantially fills the trench.

Figure 7:
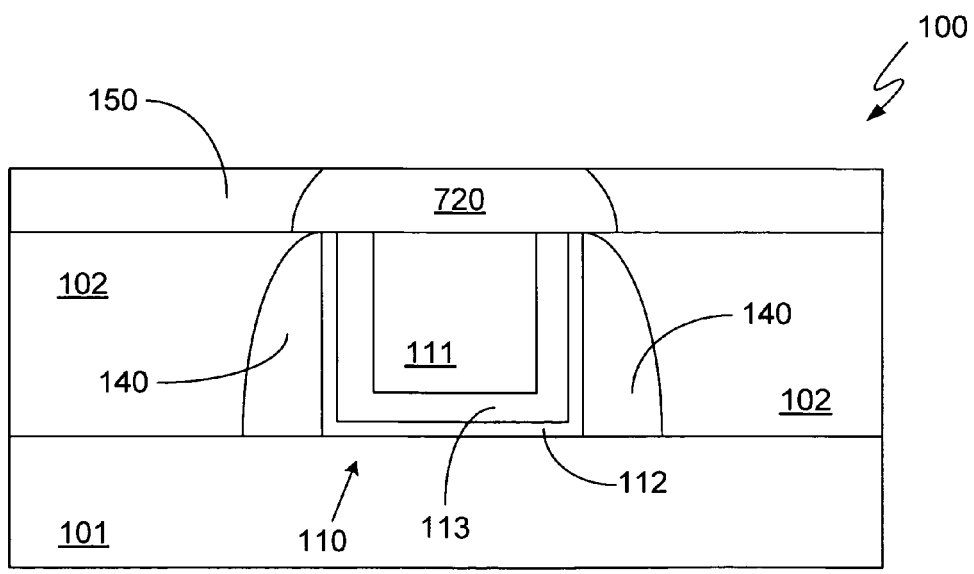
FIG. 7 is a cross sectional view of the transistor of FIG. 1 at a different point in its manufacturing process according to an embodiment of the invention.

In FIG. 7, transistor 100 is depicted after the planarizing and removing of the etch stop layer, such that the etch stop layer is not shown in FIG. 7 beyond that portion of the etch stop layer that is in trench 660 and is referred to as electrically insulating cap 720. In one embodiment, transistor 100 may be transformed from the state depicted in FIG. 7 to the state depicted in FIG. 1 by the performance of step 220 of method 200 and/or another step or series of steps.

Figure 8:
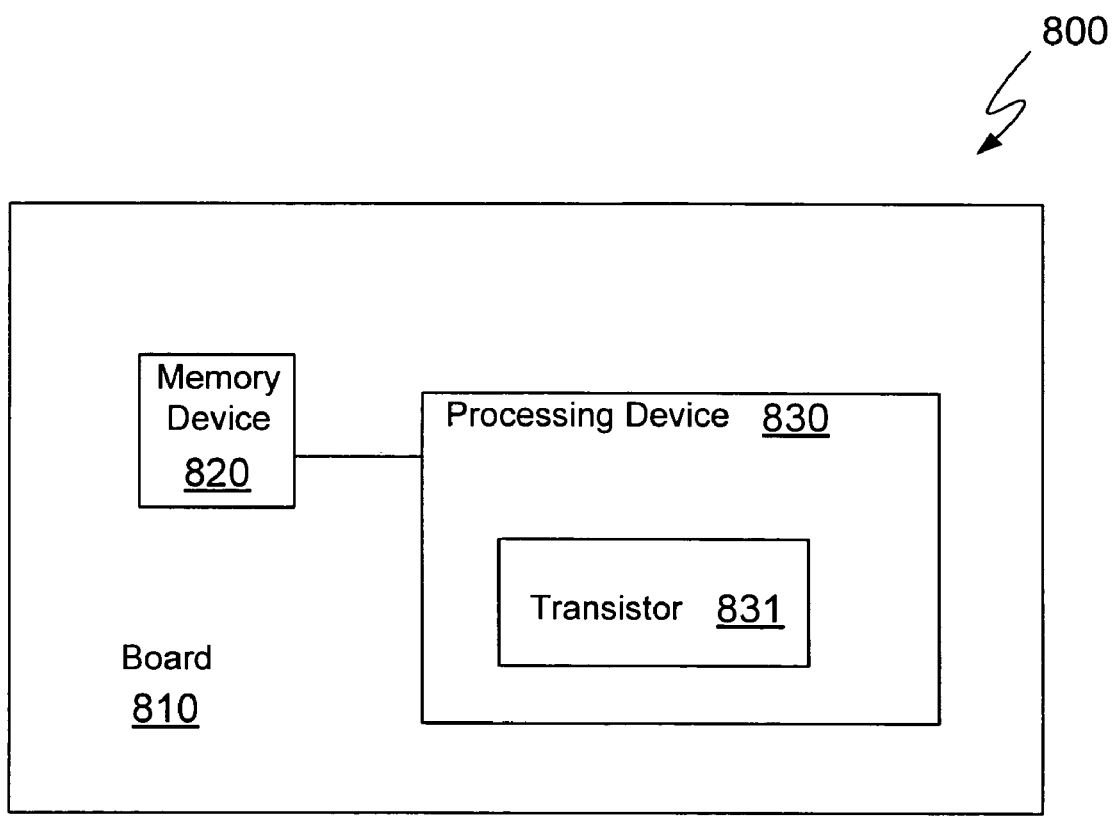
FIG. 8 is a schematic of a system that includes a transistor according to an embodiment of the invention.

FIG. 8 is a schematic of a system 800 that includes a transistor 831 according to an embodiment of the invention. As illustrated in FIG. 8, system 800 comprises a board 810, a memory device 820 disposed on board 810, and a processing device 830 disposed on board 810 and coupled to memory device 820. Processing device 830 comprises transistor 831 that in at least one embodiment may be similar to transistor 100, first shown in FIG. 1. Accordingly, in at least one embodiment, transistor 831 comprises a gate comprising a gate electrode and a gate dielectric, an electrically insulating cap over the gate, and a source/drain contact adjacent to the gate. The gate (including the gate electrode and the gate dielectric), the electrically insulating cap, and the source/drain contact are not explicitly shown in FIG. 8, but each of the stated components, along with other components of transistor 831 not specifically mentioned here, can be similar to corresponding components of transistor 100. Accordingly, for example, the electrically insulating cap prevents unwanted electrical contact between the gate and the source/drain contact.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the transistor and related substances, systems, and manufacturing methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a transistor having a metal gate, the method comprising:
   forming an etch stop layer over the metal gate; and
   forming a source/drain contact adjacent to the metal gate, wherein:
      forming the etch stop layer comprises:
         aligning the etch stop layer to the metal gate;
         forming a first capping layer over the metal gate;
         forming an electrically insulating layer over the first capping layer;
         exposing the first capping layer by removing a portion of the electrically insulating layer;
         removing the first capping layer to form a trench aligned to the metal gate; and
         filling the trench with an electrically insulating cap; and
      the etch stop layer prevents a formation of an electrical connection between the metal gate and the source/drain contact.

2. The method of claim 1 wherein:
   the metal gate is a copper gate; and
   forming the first capping layer comprises forming a layer comprising cobalt.

3. The method of claim 2 wherein:

removing the first capping layer comprises etching the first capping layer using an etchant that is an aqueous solution comprising a carboxylic acid and a corrosion inhibitor.

4. The method of claim 3 wherein:

the carboxylic acid is an α-hydroxy acid comprising no more than approximately 50 percent of the aqueous solution; and the corrosion inhibitor comprises no greater than approximately 0.2 percent of the aqueous solution.

5. The method of claim 1 wherein:

forming the first capping layer comprises electrolessly depositing the first capping layer.

* * * * *